United States Patent
Li et al.

(10) Patent No.: US 8,884,596 B2
(45) Date of Patent: Nov. 11, 2014

(54) DYNAMIC CONTROL OF FREQUENCY COMPENSATION FOR IMPROVED OVER-VOLTAGE PROTECTION IN A SWITCHING REGULATOR

(75) Inventors: Zheng Li, San Jose, CA (US); Tawen Mei, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 753 days.

(21) Appl. No.: 13/099,021

(22) Filed: May 2, 2011

(65) Prior Publication Data
US 2012/0280669 A1    Nov. 8, 2012

(51) Int. Cl.
*G05F 1/00*    (2006.01)

(52) U.S. Cl.
USPC .......................................... 323/282; 323/284

(58) Field of Classification Search
USPC ........................... 323/273, 280, 282, 284–285
See application file for complete search history.

(56) References Cited

U.S. PATENT DOCUMENTS

| | | | |
|---|---|---|---|
| 5,850,139 A * | 12/1998 | Edwards | 323/282 |
| 5,889,393 A | 3/1999 | Wrathall | |
| 6,909,268 B2 | 6/2005 | Taghizadeh-Kaschani | |
| 6,946,821 B2 * | 9/2005 | Hamon et al. | 323/273 |
| 6,975,099 B2 | 12/2005 | Wu et al. | |
| 7,012,411 B2 * | 3/2006 | Yasukouchi | 323/282 |
| 7,218,083 B2 | 5/2007 | Wang et al. | |
| 7,253,593 B1 | 8/2007 | Chen et al. | |
| 7,368,896 B2 | 5/2008 | Nagata et al. | |
| 7,583,138 B1 | 9/2009 | DeStasi et al. | |
| 7,589,517 B1 | 9/2009 | Broach et al. | |
| 7,733,074 B2 * | 6/2010 | Hasegawa et al. | 323/284 |
| 7,772,817 B2 | 8/2010 | Takagi et al. | |
| 7,863,875 B1 | 1/2011 | Guo et al. | |
| 2008/0111530 A1 * | 5/2008 | Hasegawa et al. | 323/284 |
| 2010/0301827 A1 | 12/2010 | Chen et al. | |
| 2011/0001458 A1 | 1/2011 | Bansal et al. | |

* cited by examiner

*Primary Examiner* — Jue Zhang
(74) *Attorney, Agent, or Firm* — Andrew Viger; Frederick J. Telecky, Jr.

(57) ABSTRACT

An error amplifier includes a difference amplifier providing an error signal representing a difference in voltage between a feedback signal and a reference signal. The error amplifier further includes a compensation circuit limiting the rate of change of the error signal. The compensation circuit includes a switch that when activated effectively removes a circuit portion from the compensation circuit. A switch signal indicates for the switch to be activated when the feedback signal exceeds the reference signal by a predefined amount.
The compensation circuit may further include a second switch that when activated effectively removes a second circuit portion from the compensation circuit. A second switch signal indicates for the second switch to be activated when the feedback signal exceeds the reference signal by a second predefined amount.

18 Claims, 4 Drawing Sheets

DYNAMIC CONTROL OF FREQUENCY COMPENSATION FOR IMPROVED OVER-VOLTAGE PROTECTION IN A SWITCHING REGULATOR

BACKGROUND

A power supply is generally expected to provide a constant source of power when enabled and is often further expected to withstand and recover from transients or from stress conditions occurring at the output of the power supply. For example, a power supply may withstand various overload conditions and may include over-voltage, over-current, and over-temperature protection.

A power supply may have a regulated output voltage, wherein the output voltage is generally maintained within certain limits of a regulation specification. A limitation mechanism may be included in the power supply to limit the rate of change of the output voltage.

Following the end of an overload condition the output voltage may quickly rise and exceed the regulation limits. Although the power supply may attempt to bring the output voltage back within the regulation limits quickly, the limitation mechanism may limit the rate of change of the output. Thus, the amount of time the output voltage remains in excess of the regulation limits is extended.

Additionally, if the output voltage exceeds an over-voltage threshold following the end of the overload condition, an over-voltage protection circuit may be activated and may disable portions of the power supply. Thus, there may be a further delay introduced in the power supply recovery.

An improved mechanism is therefore desirable to provide for quick power supply recovery following an overload condition.

DETAILED DESCRIPTION

A power supply converts electrical energy received in one form to electrical energy delivered in another form. For example, an AC/DC power supply converts alternating current (AC) energy into direct current (DC) energy, a DC/AC power supply converts DC energy into AC energy, a DC/DC power supply converts DC energy of one form into DC energy of another form, and an AC/AC power supply converts AC energy of one form into AC energy of another form.

A power supply may include several stages each of which may be considered a power supply itself. For example, a power supply may include an AC/AC power supply to step down a line voltage, followed by an AC/DC power supply to provide a DC voltage from the stepped-down line voltage, followed by a DC/DC power supply that provides a regulated output voltage from the DC input voltage, followed by a DC/AC power supply to convert the DC voltage into an AC voltage with a desired frequency. Thus, the term power supply encompasses any single electrical energy conversion mechanism as well as combinations of electrical energy conversion mechanisms.

One type of power supply is a switched mode power supply that switches an input from a power source to charge an energy storage circuit as needed to maintain a substantially constant load voltage or current. Buck and boost supplies are examples of switched mode power supplies. A buck supply steps down the voltage such that the output voltage is less than the input voltage. A boost supply steps up the voltage such that the output voltage is greater than the input voltage. A buck-boost supply is a combination of a buck and a boost supply, and operates in buck mode or boost mode depending on the magnitude of the input voltage.

In a buck switched mode power supply a switch may be closed periodically to connect an inductor to the power source at the input. When the switch is closed, energy from the power source is stored in the inductor. When the switch is opened, the inductor is discharged. As the percentage of time the switch is closed increases more energy is delivered to the output and the output voltage correspondingly increases. Thus, a desired voltage may be maintained at the output.

In many switched mode supplies a pulse-width modulated (PWM) signal drives a switch such as the one described above open and closed. A PWM signal has a constant frequency but varying duty cycle. Duty cycle is the percentage of time that a signal has a certain value. For example, in a signal that swings from five volts (5V) to zero volts (0V), the duty cycle may be the percentage of the signal period that the signal is above three volts (3V) or may be the percentage of the signal period that the signal is below two volts (2V). For ease of understanding and not by way of limitation, duty cycle in the remainder of this document will refer to the percentage of time a signal is at a high value, or "logic one", in a period. The switching signal in a switched mode power supply is generally but not necessarily in the form of a square wave that cycles between "logic one" and "logic zero".

The implemented logic of the power supply determines whether the switch is closed as a result of a high value or a low value of the switching signal. In some implementations a high value of the switching signal causes the switch to close and thus a short duty cycle causes the switch to remain closed for only a small percentage of the period. In other implementations a low value causes the switch to close and thus a short duty cycle causes the switch to remain closed for a large percentage of the period. For ease of understanding and not by way of limitation, throughout the remainder of this document a high value of the switching signal will be related to a closing of the switch such that a high duty cycle will cause the switch to be closed a high percentage of the period.

A signal representing the voltage across the capacitor at the output of the switched mode power supply is fed back to an error amplifier and compared to a reference voltage. The output of the error amplifier represents the difference between the actual output voltage as represented by the feedback voltage and the desired output voltage as represented by the reference voltage. The output of the error amplifier is used to set the duty cycle of the switching signal. Therefore, if the feedback voltage is greater than the reference voltage a lower duty cycle switching signal is generated, and if the feedback voltage is less than the reference voltage a higher duty cycle switching signal is generated.

In some implementations, the output polarity of the error amplifier may go positive or negative. In other implementations, the output polarity of the error amplifier may be one polarity only, either always positive or always negative.

Figure 1A:
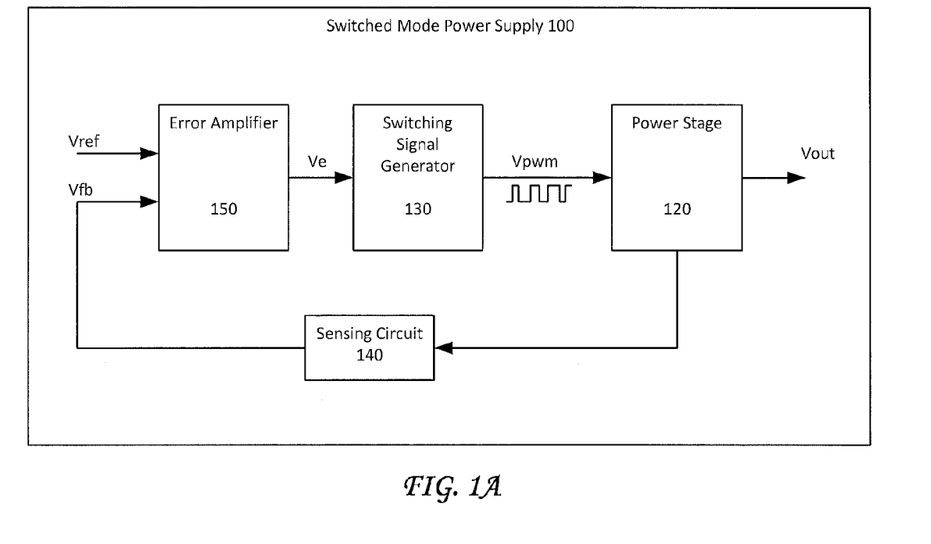
FIG. 1A illustrates a representative switched mode power supply circuit.

FIG. 1A illustrates a representative switched mode power supply 100 in block diagram form, showing some of the functional blocks and signals that may be included in a switched mode power supply. A power stage 120 outputs a voltage Vout as a function of a PWM switching signal generated by a switching signal generator 130. A sensing circuit 140 senses the voltage Vout and provides a feedback signal Vfb representing the voltage Vout to an error amplifier 150. Error amplifier 150 compares feedback signal Vfb to a reference signal Vref and outputs an error signal Ve representing the difference between Vfb and Vref. From error signal Ve, switching signal generator 130 determines the duty cycle for PWM signal Vpwm.

As a load draws power from switched mode power supply 100 at output Vout, the voltage of Vout may decrease. Ve correspondingly increases, the duty cycle of Vpwm increases, and Vout increases. Thus, Vout may be regulated to a substantially constant output voltage.

The functional blocks as shown in FIG. 1A are not a limitation on physical implementation. Switched mode power supply 100 may be implemented with discrete components, with integrated circuits, or with a combination of discrete components and integrated circuits. If the implementation includes one or more integrated circuit devices, the functionality incorporated into the device or devices may be partitioned differently than the functional partitioning of FIG. 1A. An implementation of switched mode power supply 100 may include analog and digital circuitry, and may further include firmware or software.

Figure 1B:
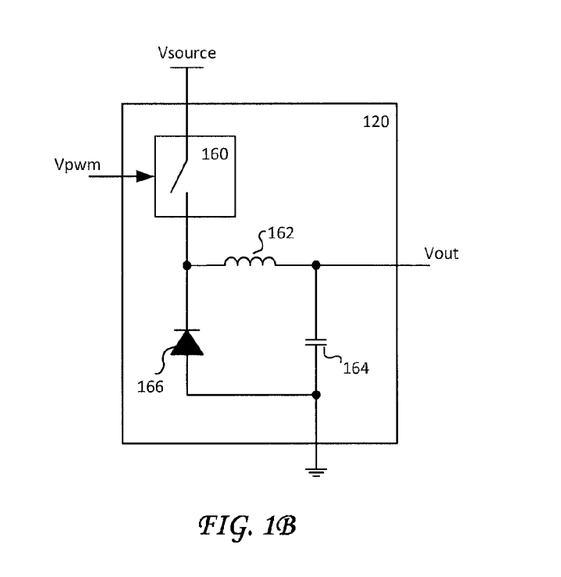
FIG. 1B illustrates representative buck power supply functionality.

FIG. 1B illustrates one example of a power stage 120 that provides buck power supply functionality for switched mode power supply 100. A power source Vsource supplies input power at an input of the switched mode power supply. The PWM signal Vpwm from switching signal generator 130 is provided to a switching mechanism at switch 160. When switch 160 is closed, inductor 162 is connected to Vsource. As current in inductor 162 ramps up, energy is stored in inductor 162. When switch 160 is opened, inductor 162 is connected to ground through a recirculation diode 166. As current in inductor 162 ramps down, energy is discharged to the load connected at Vout. Output capacitor 164 is charged when the current in inductor 162 is higher than the load current, and discharged otherwise.

A buck power stage 120 was described with respect to FIG. 1B. However, power stage 120 could be implemented with other topologies. For example, power stage 120 could be boost or buck-boost.

Diode 166 in the example of FIG. 1B may be implemented as an active switch and may even be implemented with the same type of device used to implement switch 160. Further, switch 160 and thus diode 166 may be implemented, for example, as one or more metal oxide semiconductor field effect transistors (MOSFETs) or other type of transistor.

Capacitor 164 may be implemented as multiple series or parallel capacitors or as an equivalent capacitance.

One or more of the components shown in switched mode power supply 100 may be included in a semiconductor device. In one implementation, components including switching signal generator 130, sensing circuit 140 and error amplifier 150 are included in one semiconductor device, with power stage 120 provided separately.

Figure 2:
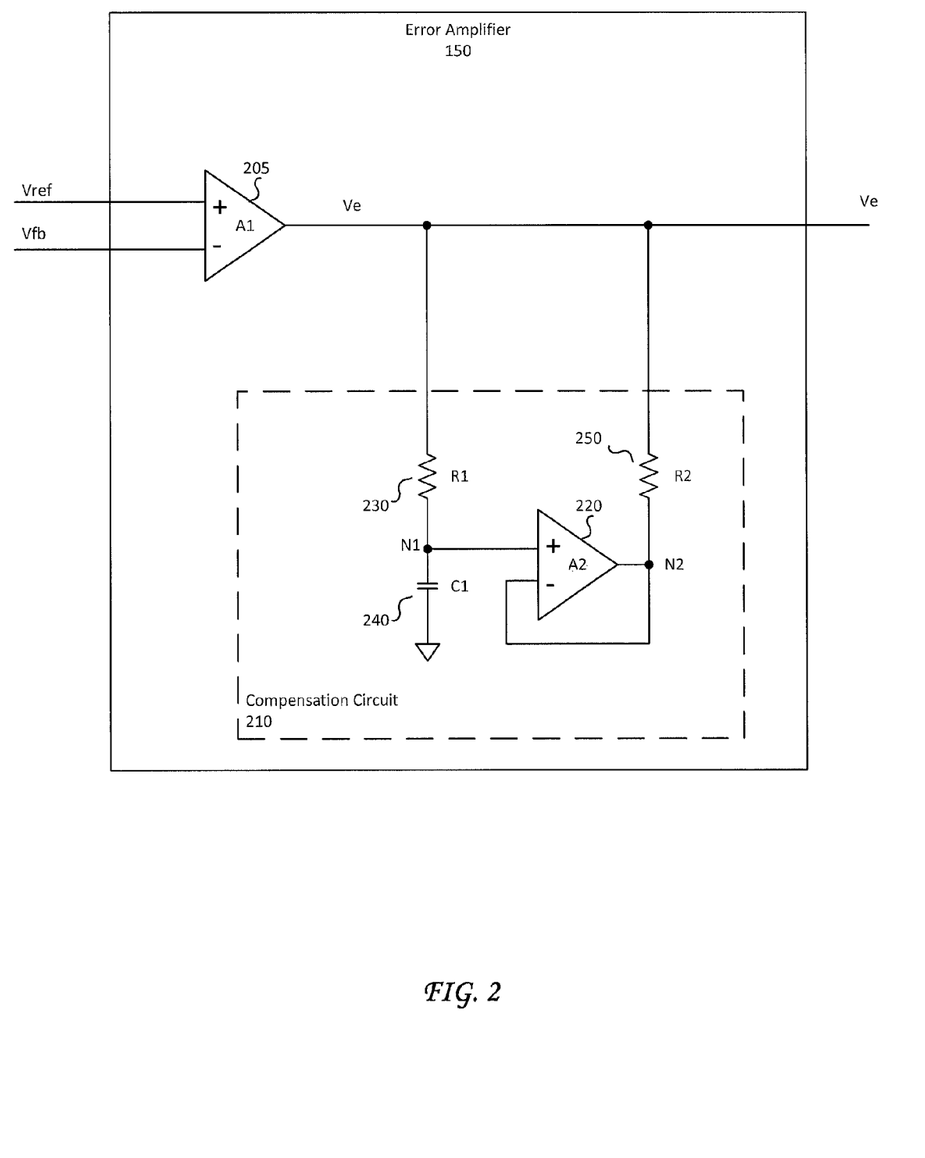
FIG. 2 illustrates a representative error amplifier including a compensation circuit that provides control loop stability through slew rate control.

FIG. 2 illustrates a representative error amplifier 150 including an amplifier 205 (labeled 'A1') and a compensation circuit 210 that provides control loop stability through slew rate control for error amplifier 150 output signal Ve. Slew rate is the rate at which a signal changes value. Control loop stability includes maintaining signal Ve within predefined bounds such that output Vout remains within predefined bounds.

Slew rate is a factor in stability and is separately a factor in the generation of electrical noise. Undesirable electrical noise may be generated when a signal changes, especially with rapidly-changing signals. The undesirable electrical noise may be coupled into the device or into neighboring devices. Thus, the rate of change of a signal may be limited not only to stabilize the control loop, but also to minimize the amount of electrical noise generated.

Amplifier A1 may be a transconductance amplifier that converts voltage information at the inputs into current information at the output. Alternatively, amplifier A1 may by any other amplifier that outputs a signal based on a comparison of two input signals. The amplification factor of A1 contributes to control loop stability. The amplification factor of A1 may be less than or equal to one.

Compensation circuit 210 is shown as one form of a Type-II compensation circuit in which amplifier 220 (labeled 'A2'), resistor 230 (labeled 'R1'), capacitor 240 (labeled 'C1'), and resistor 250 (labeled 'R2') form an active capacitor with output impedance R2 and a zero at the frequency $\frac{1}{2\pi R1 C1}$. The non-inverting input of A2 is electrically connected to resistor R1 and capacitor C1 at node N1. The inverting input of A2 is electrically connected to the output of A2 and to resistor R2.

In normal operation, compensation circuit 210 limits the slew rate of difference signal Ve, effectively integrating the feedback signal, thereby integrating out the influence of fast transients at the output and contributing to the stability of the control loop. A fast transient is generally a fast voltage spike or spikes of short duration.

In some situations a fast change in voltage level occurs at the output of the power supply but is not a fast transient. For example, the output voltage of the power supply may increase rapidly and significantly following the end of an overload condition. One example of an overload condition is a short to ground condition. The short to ground examples provided below are used to illustrate how a power supply may respond to an overload condition. During a short circuit to ground condition at the output of the power supply, the feedback signal to amplifier A1 may be nearly zero and signal Ve from amplifier A1 may therefore indicate that a maximum duty cycle switching signal should be generated. When the short circuit to ground condition ends, the output voltage may ramp up very quickly Amplifier A1 attempts to reduce Ve quickly in response but the slew rate limiting of compensation circuit 210 slows down the change in Ve. Because Ve does not change quickly, the switching signal duty cycle remains higher than the output voltage would indicate. Thus, recovery of switched mode power supply 100 is delayed, and extended overshoot of the voltage Vout at the output of the power supply may result. In turn, overshoot of the output voltage may possibly cause an overvoltage protection mechanism to be triggered. To illustrate, the following discussion refers back to FIG. 1A.

When the switched mode power supply 100 output Vout experiences a short circuit to ground, Vout is pulled to approximately zero volts. Sensing circuit 140 senses the approximately zero volts and outputs a signal Vfb representing a value of approximately zero volts. Error amplifier 150 compares Vfb to Vref and determines that Vref is much greater than Vfb, and outputs signal Ve representing the large difference between Vfb and Vref. Switching signal generator 130 interprets signal Ve as a need to provide more charge in power stage 120, thus generator 130 increases the duty cycle of signal Vpwm to a maximum. Thus, current is provided through power stage 120 to ground through the ground short with the switch closed a maximum percentage of the time.

The short to ground condition may be removed at a later time. Depending on the duration of the short to ground condition, the energy storage mechanism of power stage 120 may be fully discharged. When the short to ground condition is removed, voltage Vout jumps to the voltage representing the current energy stored within the energy storage mechanism of power stage 120.

Sensing circuit 140 output Vfb increases to reflect the increased voltage Vout when the short to ground condition is removed. Error amplifier 150 correspondingly attempts to lower amplifier voltage Ve to cause a decreased duty cycle for signal Vpwm. However, compensation circuit 210 (FIG. 2) performs a limiting function as described above, thus limiting the rate of change of signal Ve. With signal Ve rate of change limited, Ve decreases slowly and switching signal Vpwm duty cycle correspondingly decreases slowly. The energy storage mechanism of power stage 120 continues to charge more than necessary, and output voltage Vout exceeds the nominal output voltage for which the power supply was designed. If Vout exceeds an overvoltage threshold then an overvoltage protection circuit may be triggered and, for example, power stage 120 disabled. Whether or not overvoltage protection is triggered, the overshoot of Vout at the end of a short to ground condition is generally undesirable behavior.

There may be causes other than the end of a short circuit to ground for a fast-occurring voltage change at the output of switched mode power supply 100. Further, a short circuit to ground is just one example of an overload condition, wherein the load attempts to draw more current than the power supply can provide. Additionally, an overvoltage condition may occur independently, not caused by the delay introduced by compensation circuit 210.

One solution for minimizing the overshoot described is to allow signal Ve to decrease rapidly following the end of an overload condition.

Figure 3:
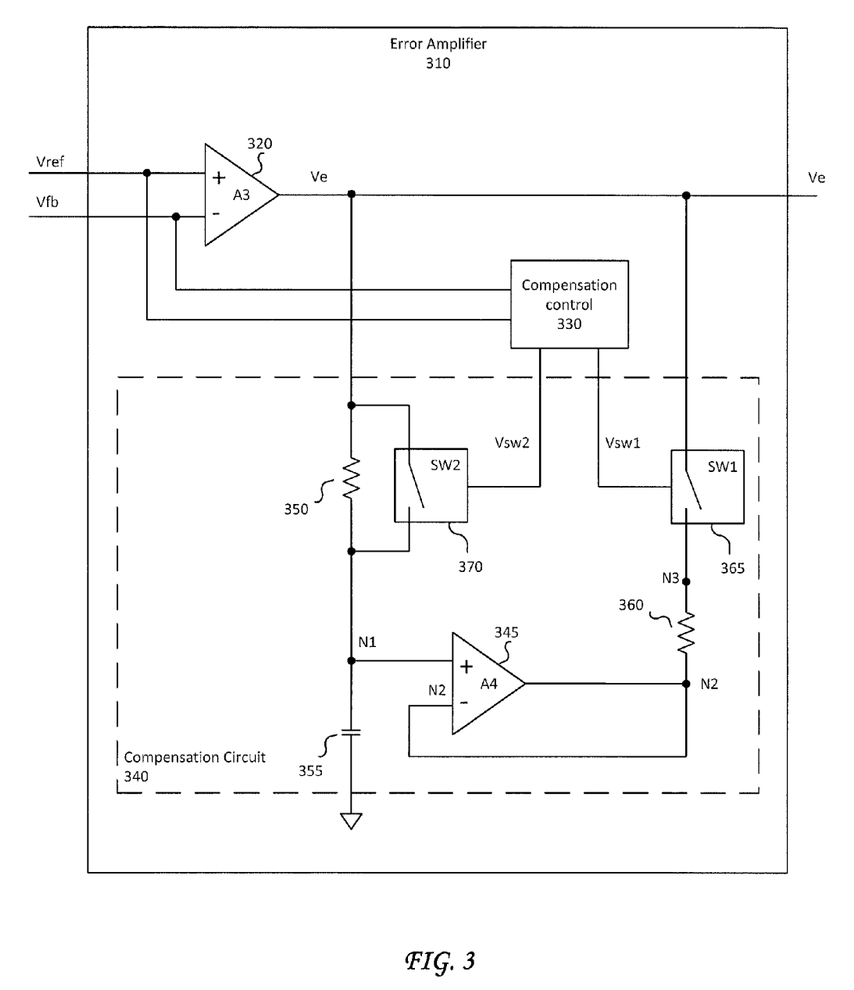
FIG. 3 illustrates an exemplary implementation of an error amplifier including controls for adjusting a frequency compensation network.

FIG. 3 illustrates an exemplary implementation of an error amplifier 310 that adjusts the slew rate limitation provided by a compensation circuit thereby allowing a more rapid recovery following an overload condition. Error amplifier 310 includes amplifier 320 (labeled 'A3'), compensation control 330, and compensation circuit 340 including amplifier 345 (labeled 'A4'), switches 365 (labeled 'SW1') and 370 (labeled 'SW2'), resistors 350 and 360, and capacitor 355.

Amplifier A3 performs a function similar to the function described for amplifier A1 in FIG. 2, outputting a signal Ve representative of the difference between signals Vref and Vfb. Compensation circuit 340 performs a function similar to the compensation circuit 210 of FIG. 2, providing for limiting the rate of change of signal Ve. Compensation control 330 outputs signals Vsw1 and Vsw2 to control switches SW1 and SW2, respectively, to reduce the slew rate limitation of compensation circuit 340 under certain circumstances, as described below. In some implementations, only one of switch SW1 and SW2 with corresponding control is included in compensation circuit 340. In other implementations, compensation control 330 may include additional switches providing additional options for adjusting slew rate control.

During normal switched mode power delivery, for example in a switched mode power supply 100, error amplifier switch SW1 is closed and switch SW2 is open so that compensation circuit 340 functions as an active capacitor to limit the slew rate of signal Ve.

When switched mode power supply 100 output voltage Vout increases such that feedback signal Vfb exceeds reference signal Vref by a predefined amount, compensation control 330 asserts signal Vsw1 to open SW1 and remove the limitation on Ve provided by amplifier A4 and resistor 360. The slew rate limitation on signal Ve with switch SW1 open is provided only by the series combination of resistor 350 and capacitor 355. The impedance of the combination of resistor 350 and capacitor 355 is generally much higher than the effective impedance of compensation circuit 340 with switch SW1 closed. Thus, with SW1 open, signal Ve is allowed to decrease quickly. As Ve approaches a lower limit the duty cycle of the switching signal Vpwm correspondingly decreases to a lower limit and current to Vout is reduced to a minimum or eliminated. When Vout later recovers to a normal operational level, Ve increases and the duty cycle of the switching signal Vpwm is increased to resume maintenance of the normal operational output voltage.

However, because capacitor 355 discharges slowly through large resistor 350, it may be that capacitor 355 holds a charge when Vout returns to a normal operational level. Thus, signal Ve may be held at a higher voltage by capacitor 355 than is indicated for maintaining Vout at a normal operational level. Correspondingly, the duty cycle of the switching signal may be too high, resulting in the current delivered to Vout being too high and causing Vfb to exceed Vref again. While capacitor 355 is overcharged, therefore, the power supply could cycle into and out of over-voltage protection mode several times before signal Ve stabilizes.

To mitigate cycling as described above, compensation control 330 may additionally assert signal Vsw2 when feedback signal Vfb exceeds reference signal Vref by a predefined amount. Signal Vsw2 causes switch SW2 to close and place a short circuit across resistor 350. When switch SW1 is open and switch SW2 is closed, only capacitor 355 contributes to the slew rate control of signal Ve. Without resistor 350 limiting the current, capacitor 355 may discharge more quickly and not hold signal Ve to an artificially high level.

Thus, switch SW1 provides for adjustable slew rate control of error amplifier output signal Ve, and switch SW2 speeds up discharge of compensation capacitor 355 for faster recovery following an overvoltage condition.

When one or both of switches SW1 and SW2 are implemented with an active switching mechanism, such as by a transistor, switch SW1 or SW2 may not only be switched fully on and off, but may be operated in a partially on mode, providing a range of control.

Error amplifier 310 may be implemented with many different circuit topologies other than the exemplary circuit illustrated in FIG. 3. A variety of switches may be controlled by compensation control 330 in other topologies to switch in or out the various components of the circuit topology. Further, a switch may be implemented that when activated effectively removes compensation circuit 340 from error amplifier 310 completely.

Switches SW1 and SW2 may be controlled separately or together. For example, there may one predefined threshold for the difference Vfb−Vref that causes signal Vsw1 to be asserted, and another predefined threshold for the difference Vfb−Vref that causes signal Vsw2 to be asserted. Alternatively, there may one predefined threshold for the difference Vfb−Vref that causes both signals Vsw1 and Vsw2 to be asserted.

A predefined threshold may be determined based on allowable output voltage Vout tolerance, power supply 100 component tolerances, switching signal Vpwm resolution, and the like. Because the detection occurs within the error amplifier 310 that provides for closed-loop regulation of the output voltage Vout, the difference between Vref and Vfb that indicates an overvoltage condition may be small or even zero. This translates into a lower overvoltage threshold for output Vout and correspondingly quicker overvoltage detection. In comparison, for example, ground offsets and other tolerances between error amplifier 310 and an overvoltage detection circuit external to error amplifier 310 could force an overvoltage detection threshold to be set higher.

Thus, error amplifier 310 not only provides for faster rate of change for signal Ve under certain conditions, but may additionally provide for quick and accurate overvoltage detection.

The error amplifier 310 of the example of FIG. 3 is illustrated indicating that compensation control 330 evaluates signals Vref and Vfb separately from the evaluation performed by amplifier A3. In some implementations, however, a portion of compensation control 330 may be included within amplifier A3 to reduce component count, reduce integrated circuit size, or the like.

Figure 4:
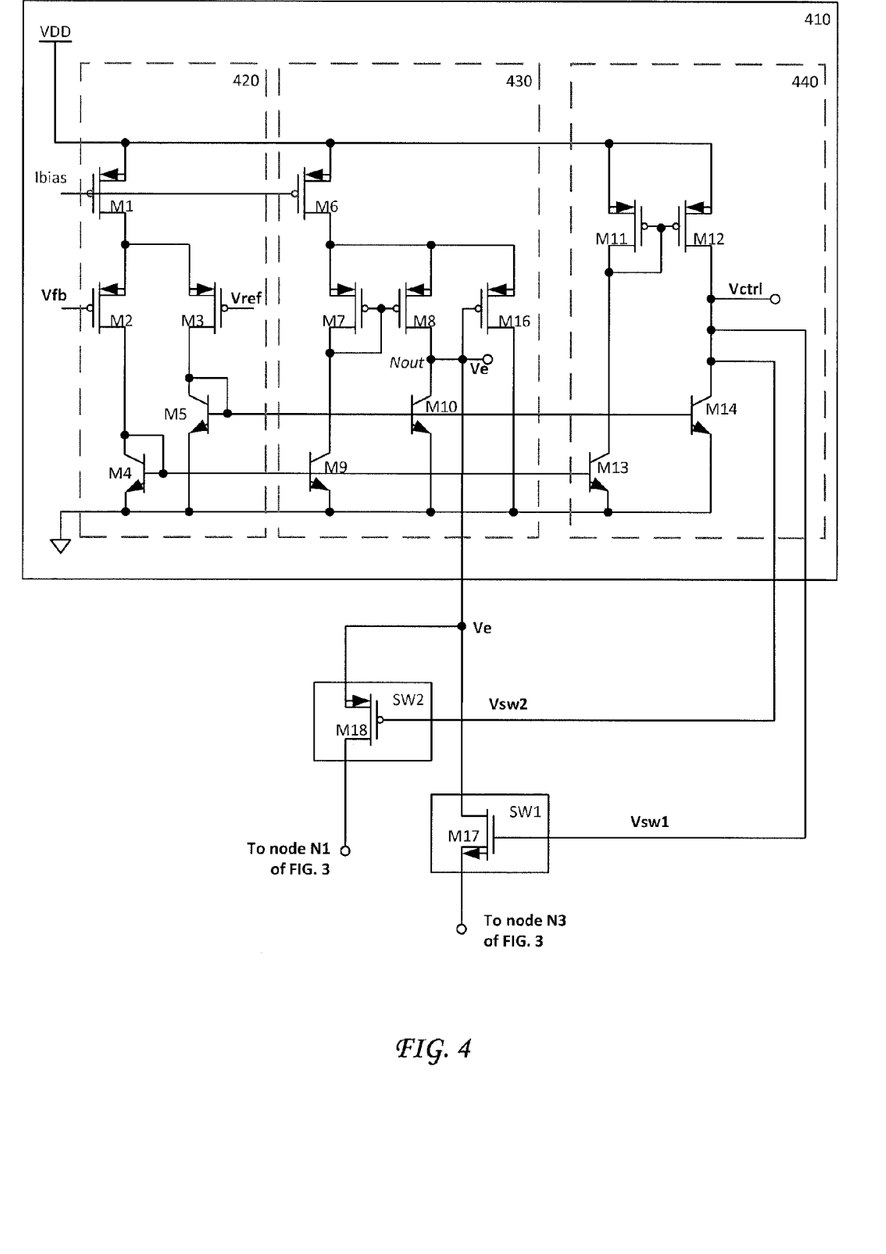
FIG. 4 illustrates an exemplary circuit including an amplifier and a compensation control.

FIG. 4 illustrates an exemplary circuit 410 incorporating an amplifier 320 and further incorporating compensation control 330. The circuit topology illustrated in FIG. 4 is just one example of an implementation of portions of the error amplifier 310 of FIG. 3. Other circuit topologies may alternatively be implemented.

Circuit 410 includes sections 420, 430, and 440. Sections 420 and 430 together implement the functionality of amplifier A3 in FIG. 3. Section 420 is also used in combination with section 440 to implement the functionality of compensation control 330 in FIG. 3. Thus, section 420 is shared, thereby increasing accuracy and reducing component count.

Section 420 includes transistors M1-M5; section 430 includes transistors M6-M10 and M16; and section 440 includes transistors M11-M14. As is known, a bias current Ibias set from a bandgap voltage is applied to the gates of M1 and M6 causing the respective currents through M1 and M6 to be proportional to each other, the proportionality of the currents based on the proportionality of the geometry of M1 and M6. M1 provides operating current for section 420, and M6 provides operating current for section 430.

Signal Vfb is applied to the gate of M2. If Vfb falls below the turn-on threshold for M2, M2 will conduct current and M4 will conduct a current equal to the current through M2. If Vfb goes above the turn-on threshold for M2, M2 will be off and conduct no current and M4 correspondingly conducts no current.

Signal Vref is applied to the gate of M3. Vref is a constant voltage and the current through M3 is therefore a constant current. M5 will conduct a current equal to the current through M3.

When the magnitude of Vfb is less than the magnitude of Vref, M2 conducts more current than M3 so M4 conducts more current than M5. Conversely, when the magnitude of Vfb is greater than the magnitude of Vref, M3 conducts more current than M2 so M5 conducts more current than M4.

M4 is constructed similarly to M9. M5 is constructed similarly to M10. The base-emitter voltage of M9 is equal to the base-emitter voltage of M4 and the base-emitter voltage of M10 is equal to the base-emitter voltage of M5. Therefore, M9 is a current mirror of M4 and the current through M9 is equal to the current through M4. Similarly, M10 is a current mirror of M5 and the current through M10 is equal to the current in M5.

M7 is constructed similarly to M8. The gate voltage of M7 is equal to the gate voltage of M8. Thus, M8 is a current mirror for M7 and the current through M8 is equal to the current through M7. The current through M7 is equal to the current through M9.

If the current through M5 is greater than the current through M4, then the current through M10 is correspondingly greater than the current in M9. M8 will not be able to supply the whole current for M10 because it is limited to the current in M9. The difference between the current of M8 and M10 is sunk by section 430 at node Nout. Signal Ve by its polarity reflects the sinking of current.

If the current through M5 is less than the current in M4, then the current through M10 is correspondingly less than the current in M9, and M8 will supply more current than M10 can sink. The difference between the current of M8 and M10 is sourced by section 430 at node Nout. Signal Ve by its polarity reflects the sourcing of current.

Therefore, the amplifier implemented by sections 420 and 430 as illustrated in FIG. 4 is a transconductance amplifier that reflects by the current at Nout the difference between the gate voltages of inverting input M2 and non-inverting input M3.

Transistor M16 in the illustration of FIG. 4 is included as a current sink for excess current of M6.

The analysis for the output of section 440 is similar to the analyses above for section 430. M13 is a current mirror of M4. M14 is a current mirror of M5. When Vfb is less than Vref, the current through M13 is greater than the current through M14. The current through M11 is equal to the current through M13. M12 is a current mirror of M11 and thus the current through M12 is equal to the current through M11. The current through M13 (and correspondingly M12) is greater than the current through M14, and excess current is sourced through node Vctrl from M12. An increase in the difference Vref−Vfb results in an increase in the voltage at node Vctrl.

When Vfb is greater than Vref, the current through M14 becomes greater than the current through M13. M12 cannot source enough current for M14, so current is also sunk through node Vctrl to M14. An increase in the difference Vfb−Vref results in a decrease of the voltage at node Vctrl.

If the voltage at node Vctrl decreases below the turn-on threshold of M17, M17 turns off. In some implementations, circuit 410 is designed such that M17 is off for any value of Vfb greater than Vref, so that amplifier A4 and resistor 360 of FIG. 3 are effectively removed from compensation circuit 340 for any overvoltage condition. In other implementations, circuit 410 is designed such that M17 is off for any value of the difference Vfb−Vref greater than a predefined threshold value.

If the voltage at node Vctrl decreases below the turn-on threshold of M18, M18 turns on. In some implementations, circuit 410 is designed so that M18 is on for any value of Vfb greater than Vref so that resistor 350 of FIG. 3 is shorted across and effectively removed from compensation circuit 340 for any overvoltage condition. In other implementations, circuit 410 is designed such that M18 is on for any value of the difference Vfb−Vref greater than a predefined threshold value.

Therefore, when recovery from an overload condition causes an overvoltage condition at the output of switched mode power supply 100, error amplifier 310 may cause switch SW1 to open or cause SW2 to close, leaving compensation circuit 340 less able to provide slew rate limiting. Consequently, quicker and more accurate recovery following an overload condition may be achieved.

Additionally, because the overvoltage sensing is performed within error amplifier 310 a quicker reaction to an overvoltage condition at the power supply 100 output may be achieved.

Control signals Vsw1 and Vsw2 are substantially equivalent in the implementation of FIG. 4, both coming from node Vctrl of section 440. In other implementations signals Vsw1 and Vsw2 are generated separately.

In FIG. 4, switch SW1 is illustrated as being an NMOS transistor and switch SW2 is illustrated as being a PMOS transistor. In other implementations switch SW1 may be a PMOS transistor and switch SW2 an NMOS transistor. In yet other implementations, switches SW1 and SW2 may both be PMOS or may both be NMOS. The logic of section 440 may be changed to implement switches SW1 and SW2 in the technology desired.

The transistors of FIG. 4 are illustrated as one particular combination of MOSFETs and bi-polar junction (BJT) transistors. However, the error amplifier of FIG. 4 may be implemented using many other combinations of MOSFETs, BJTs, or other transistor types.

CONCLUSION

The output voltage of a switched mode power supply is monitored. Based on the difference between a reference signal and a feedback signal representing the output voltage, an error amplifier provides a control signal that may be used to adjust a compensation circuit of the error amplifier. Thus, a fast voltage change or overvoltage condition at the output of the switched mode power supply may be quickly detected and quick reaction may be possible. Further, an overvoltage detection threshold in the error amplifier may be set at a level lower than is possible for an overvoltage detection threshold in a circuit external to the error amplifier.

Another advantage of overvoltage detection included in the error amplifier may be fewer components and smaller circuit size.

What is claimed is:

1. An error amplifier with slew rate compensation, operable in a switched mode power supply, comprising:
    a difference amplifier providing an error signal representing at least in part a difference in voltage between a feedback signal at a first input and a reference signal at a second input;
    a compensation circuit providing a limitation on the rate of change of the error signal, including
        a first switch that when activated effectively removes a first circuit portion from the compensation circuit; and
        a second switch that when activated effectively removes a second circuit portion from the compensation circuit; and
    a compensation control providing
        a first switch signal for the first switch, the first switch signal indicating for the first switch to be activated when the feedback signal exceeds the reference signal by a first predefined amount;
        a second switch signal for the second switch, the second switch signal indicating for the second switch to be activated when the feedback signal exceeds the reference signal by a second predefined amount.

2. The error amplifier of claim 1, the first circuit portion including
    an amplifier, an output of the amplifier being electrically connected to an inverting input of the amplifier, the output of the amplifier being further electrically connected to a first circuit component;
    such that when the first switch is activated the effective impedance of the compensation circuit is reduced from a first effective impedance to a second effective impedance.

3. The error amplifier of claim 1, the first switch signal being substantially equivalent to the second switch signal.

4. The error amplifier of claim 1, the second predefined amount being substantially equal to the first predefined amount.

5. The error amplifier of claim 4, the first predefined amount being substantially equal to zero.

6. The error amplifier of claim 1, the second circuit portion including a second circuit component such that when the second switch is activated the effective impedance of the compensation circuit is reduced from the second effective impedance to a third effective impedance.

7. The error amplifier of claim 1, at least a portion of the difference amplifier and at least a portion of the compensation control being implemented using the same circuit components.

8. The error amplifier of claim 7, including
    a first transistor electrically connected to the first input, the first transistor conducting a first transistor current according to the voltage of the feedback signal;
    a second transistor electrically connected to the second input, the second transistor conducting a second transistor current according to the voltage of the reference signal;
    a third transistor electrically connected to the first transistor and conducting the first transistor current;
    a fourth transistor electrically connected to the second transistor and conducting the second transistor current;
    a differential circuit mirroring the first transistor current from the third transistor, mirroring the second transistor current from the fourth transistor, and providing the error signal as a function of the difference between the mirrored first transistor current and the mirrored second transistor current; and
    a controller circuit mirroring the first transistor current from the third transistor, mirroring the second transistor current from the fourth transistor, and providing a control signal as a function of the difference between the mirrored first transistor current and the mirrored second transistor current; the first switch signal and the second switch signal being substantially equivalent to the control signal.

9. The error amplifier of claim 8, the first, second, third and fourth transistors being field effect transistors (FETs).

10. The error amplifier of claim 1, the first switch and the second switch being field effect transistors (FETs).

11. The error amplifier of claim 8, the first switch and the second switch being field effect transistors (FETs) and implemented with opposite polarity.

12. A method of slew rate compensation, operable in a switched mode power supply, comprising:
    providing an error signal representing at least in part a difference in voltage between a feedback signal at a first input of a difference amplifier and a reference signal at a second input of the difference amplifier;
    providing in a compensation circuit a limitation on the rate of change of the error signal;
    providing a first switch signal and a second switch signal; and
    activating a first switch based on the first switch signal, thereby effectively removing a first circuit portion from the compensation circuit and adjusting the limitation on the rate of change of the error signal; and
    activating a second switch based on the second switch signal, thereby effectively removing a second circuit portion from the compensation circuit and adjusting the limitation on the rate of change of the error signal.

13. The method of claim 12, the first switch signal being substantially equivalent to the second switch signal.

14. The method of claim 12, the second predefined amount being substantially equal to the first predefined amount.

15. The method of claim 14, the first predefined amount being substantially equal to zero.

16. A switched mode power supply, comprising:
a difference amplifier providing an error signal representing at least in part a difference in voltage between a feedback signal at a first input and a reference signal at a second input;
a compensation circuit providing a limitation on the rate of change of the error signal, including
a first switch that when activated effectively removes a first circuit portion from the compensation circuit; and
a second switch that when activated effectively removes a second circuit portion from the compensation circuit; and
a compensation control circuit providing
a first switch signal for the first switch, the first switch signal indicating for the first switch to be activated when the feedback signal exceeds the reference signal by a first predefined amount; and
a second switch signal for the second switch, the second switch signal indicating for the second switch to be activated when the feedback signal exceeds the reference signal by a second predefined amount.

17. The switched mode power supply of claim 16, at least a portion of the difference amplifier and at least a portion of the compensation control being implemented using the same circuit components.

18. The switched mode power supply of claim 17, including
a first transistor electrically connected to the first input, the first transistor conducting a first transistor current according to the voltage of the feedback signal;
a second transistor electrically connected to the second input, the second transistor conducting a second transistor current according to the voltage of the reference signal;
a third transistor electrically connected to the first transistor and conducting the first transistor current;
a fourth transistor electrically connected to the second transistor and conducting the second transistor current;
a differential circuit mirroring the first transistor current from the third transistor, mirroring the second transistor current from the fourth transistor, and providing the error signal as a function of the difference between the mirrored first transistor current and the mirrored second transistor current; and
a controller circuit mirroring the first transistor current from the third transistor, mirroring the second transistor current from the fourth transistor, and providing a control signal as a function of the difference between the mirrored first transistor current and the mirrored second transistor current; the first switch signal and the second switch signal being substantially equivalent to the control signal.

\* \* \* \* \*